(12) United States Patent
Sugita

(10) Patent No.: US 6,754,115 B2
(45) Date of Patent: Jun. 22, 2004

(54) NONVOLATILE SEMICONDUCTOR MEMORY DEVICE WITH BACKUP MEMORY BLOCK

(75) Inventor: Mitsuru Sugita, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/101,317

(22) Filed: Mar. 20, 2002

(65) Prior Publication Data

US 2003/0081478 A1 May 1, 2003

(30) Foreign Application Priority Data

Oct. 29, 2001 (JP) ........................................ 2001-330762

(51) Int. Cl.⁷ ........................... G11C 7/00; G11C 16/07; G11C 8/00
(52) U.S. Cl. .................. 365/201; 365/200; 365/185.11; 365/230.03
(58) Field of Search ................................ 365/201, 200, 365/185.11, 230.03

(56) References Cited

U.S. PATENT DOCUMENTS

| | | | | |
|---|---|---|---|---|
| 4,942,556 A | * | 7/1990 | Sasaki et al. ................ | 365/200 |
| 5,357,473 A | * | 10/1994 | Mizuno et al. ............. | 365/201 |
| 5,726,930 A | * | 3/1998 | Hasegawa et al. .......... | 365/145 |
| 6,031,758 A | | 2/2000 | Katayama et al. | |
| 6,198,659 B1 | * | 3/2001 | Hirano ................... | 365/185.09 |
| 6,262,926 B1 | * | 7/2001 | Nakai ......................... | 365/200 |
| 6,553,510 B1 | * | 4/2003 | Pekny ........................... | 714/6 |
| 2001/0022750 A1 | * | 9/2001 | Urakawa .................... | 365/200 |
| 2002/0015341 A1 | * | 2/2002 | Urakawa .................... | 365/200 |
| 2002/0031025 A1 | * | 3/2002 | Shimano et al. ............ | 365/201 |
| 2003/0128618 A1 | * | 7/2003 | Harari et al. .......... | 365/230.03 |

FOREIGN PATENT DOCUMENTS

JP 7-312096 11/1995

* cited by examiner

Primary Examiner—David Nelms
Assistant Examiner—Ly Duy Pham
(74) Attorney, Agent, or Firm—Burns, Doane, Swecker & Mathis, LLP

(57) ABSTRACT

Defect information about a defective memory block is stored into a large capacity memory block having a low rewrite frequency and a block select circuit is provided that selects a backup memory block when the stored defect information is referred and the defective memory block is selected.

6 Claims, 8 Drawing Sheets

NONVOLATILE SEMICONDUCTOR MEMORY DEVICE WITH BACKUP MEMORY BLOCK

BACKGROUND OF THE INVENTION

1. Field of the Invention

The present invention relates to a non-volatile semiconductor memory device, and particularly, to defect saving for a flash memory.

2. Description of the Background Art

In recent years, attention has been focused on a flash memory, which is a non-volatile semiconductor memory device. The flash memory is rewritable, which is a non-volatile memory, and simple in element structure, which enables a chip area thereof to be smaller than DRAM (Dynamic Random Access Memory), leading to its advantage of easy increase in integration degree and so on. Furthermore, the flash memory requires neither refresh operation with battery backup nor the like since it is a non-volatile memory. Therefore, its power consumption can be reduced. Moreover, since its chip area is small, the flash memory is suited for mass production, thereby enabling its fabrication at low cost.

Data read in a flash memory can be performed in small data units such as a byte or a word, similar to operation in DRAM. On the other hand, data write generally adopts a system in which the number of rewrite times is reduced with one block unit as a rewrite unit since limitation is imposed on the number of rewrite times from a structure of a flash memory element.

FIG. 10 shows a memory map for a general flash memory in which address assignment is performed in each memory block as a unit.

Here, as one example, memory blocks are assigned in a region of addresses of 000000 to FFFFFF.

However, the number of rewrite times is larger in a region managing information of a data file such as a directory region, for example, than in other regions. Here, if a memory block M1 with a start address is assigned to the directory region, rewrite on only memory block M1 frequently occurs, exceeding a limit number of rewrite times on a flash memory at an earlier time than other regions. When the limit number of rewrite times is exceeded, an element is subjected to degradation or the like inconvenience to be defective, resulting in a case where neither data read nor data write can be correctly performed. Therefore, a problem arises that a non-volatile semiconductor memory device can not be used in the entirety any longer because of failure of only a particular memory block having a high rewrite frequency.

SUMMARY OF THE INVENTION

It is an object of the present invention is to solve the above problem to thereby increase an useful time of a non-volatile semiconductor memory device represented by a flash memory.

A non-volatile semiconductor memory device of the present invention includes: a memory array including plural first memory blocks including memory cells having a high data rewrite frequency, a second memory block including memory cells having a low data rewrite frequency and a redundancy memory block for use in substitution for a defective memory block among the plural of first memory blocks; a control circuit not only determining whether or not a defect arises in each of the plural first memory blocks, which is an object for data rewrite, when data write processing is performed on the plural first memory blocks, but for storing defect information for indicating the defective memory block into a first region of the second memory block if a defect is detected; and a select circuit for selecting the redundancy memory block in company with selection of the defective memory block based on the defect information stored in the first region of the second memory block and select information for indicating selection of each of the plural first memory blocks.

Therefore, a main advantage of the present invention is that defect information about the plural first memory blocks is stored into the second memory block and the redundancy memory block is selected, in company with selection of the defective memory block, based on the stored defect information, and select information for indicating the selection of each of the plural first memory blocks, thereby enabling increase in useful time of a non-volatile semiconductor memory device with ease since saving is required to be effected on only a defective memory block having an especially high data rewrite frequency.

Preferably, the second memory block further includes a second region having information that is an access object in company with cancellation of a reset state and the control circuit reads the defect information stored in the first region of the second memory block after the reset state is cancelled according to an instructing signal inputted externally at the same time as access to the second region to furthermore output the defect information to the select circuit.

Moreover, another advantage of the present invention is that since the control circuit reads defect information from the second memory block after the reset state is cancelled according to an operation signal inputted externally to output the information to the select circuit, control can be performed with ease only by timing adjustment of an operation instructing signal.

Preferably, the non-volatile semiconductor memory device further includes a determination circuit for outputting a defect signal to the select circuit based on the defect information stored in the first region of the second memory block and the select circuit selects one of the plural first memory blocks and the redundancy memory block based on a select signal selecting one of the plural first memory blocks and the defect signal.

Especially, the determination circuit reads the defect information stored in the first region of the second memory block to furthermore, outputs the defect signal to the select circuit according to the read-out defect information during a period when operation of the control circuit pauses, and the select circuit selects the redundancy memory block according to the inputted defect signal and the inputted select signal in company with selection of the defective memory block after the pause of operation of the control circuit is cancelled.

Furthermore, a still another advantage of the present invention is that since the defect information can be transmitted to the select circuit during a period when operation of the control circuit pauses, no necessity arises for reading the defect information after the control circuit starts operation, thereby improving an efficiency in development.

Preferably, a data storage capacity of each of the plural first memory blocks is smaller than a data storage capacity of the second memory block.

Moreover, a further advantage of the present invention is that since the data storage capacity of each of the plural first memory blocks is smaller than the data storage capacity of the second memory, an area occupied by the redundancy memory block that can substitute for each of the plural first memory blocks can be reduced to thereby decrease an occupancy percentage of an area of all the memory array relative to a chip.

Preferably, the memory cell stores data, writable and erasable electrically, in a non-volatile way.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Detailed description will be given of embodiments of the present invention with reference to the accompanying drawings. Note that in the figures, the same or corresponding constituents are attached with the same reference symbols and none of descriptions thereof is repeated.

First Embodiment

Figure 1:
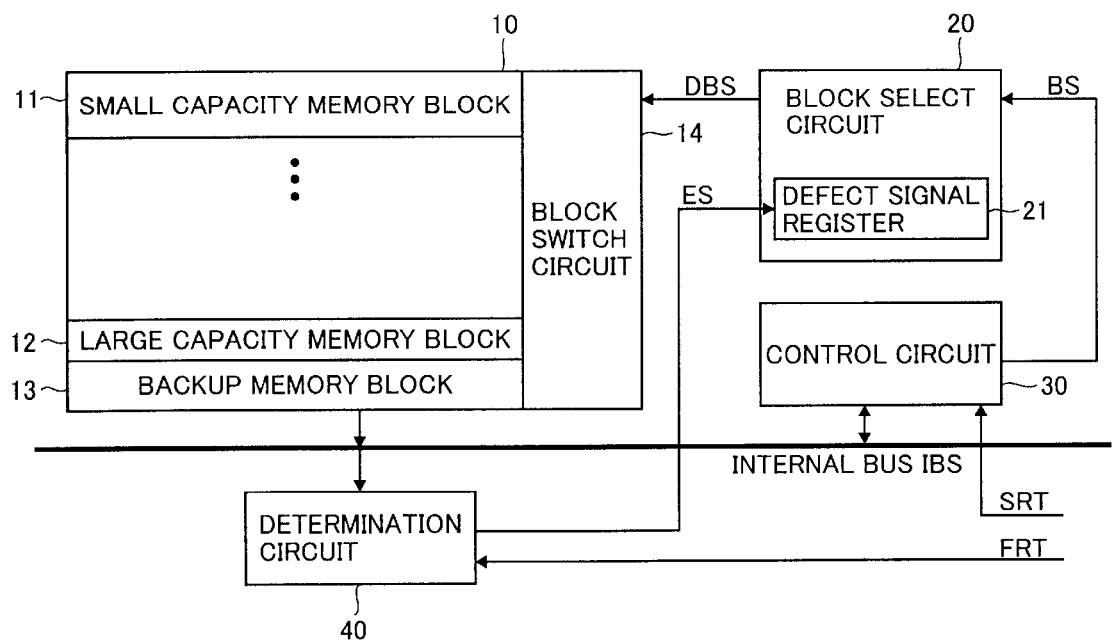
FIG. 1 is a circuit diagram of a configuration of a non-volatile semiconductor memory device 100 according to a first embodiment of the present invention.

Referring to FIG. 1, a non-volatile semiconductor memory device 100 includes: a memory array 10; a block switch circuit 14; a block select circuit 20; a control circuit 30; a determination circuit 40; and an internal bus IBS.

Memory array 10 includes: small capacity memory blocks 11 having a high rewrite frequency; a large capacity memory block 12 having a low rewrite frequency; a backup memory block 13 having the same capacity as small capacity memory block 11, and provided for saving a defective memory block.

Generally, even a rewritable memory stores programs as much of the contents thereof and therefore, an amount of data rewritable during operation of the system is small.

Therefore, in the present invention, information (data, a program and so on) having a low rewrite frequency is designed so as to be stored in division regions of large capacity memory block 12 at a design stage. Furthermore, information (data, a program and so on) having a high rewrite frequency is designed so as to be stored in division regions as small capacity memory blocks 10.

With such an architecture adopted, since it is only required that a small capacity memory block exceeding a limit number of rewrite times is saved, a chip area of backup memory block 13 decreases, enabling reduction in area of the memory array in the entirety.

Control circuit 30 performs control of the entire internal circuits through internal bus IBS to perform processes such as writing, reading, erasing and the like.

Internal bus IBS performs communicating of address information, data information or the like with each of the internal circuits.

Figure 2:
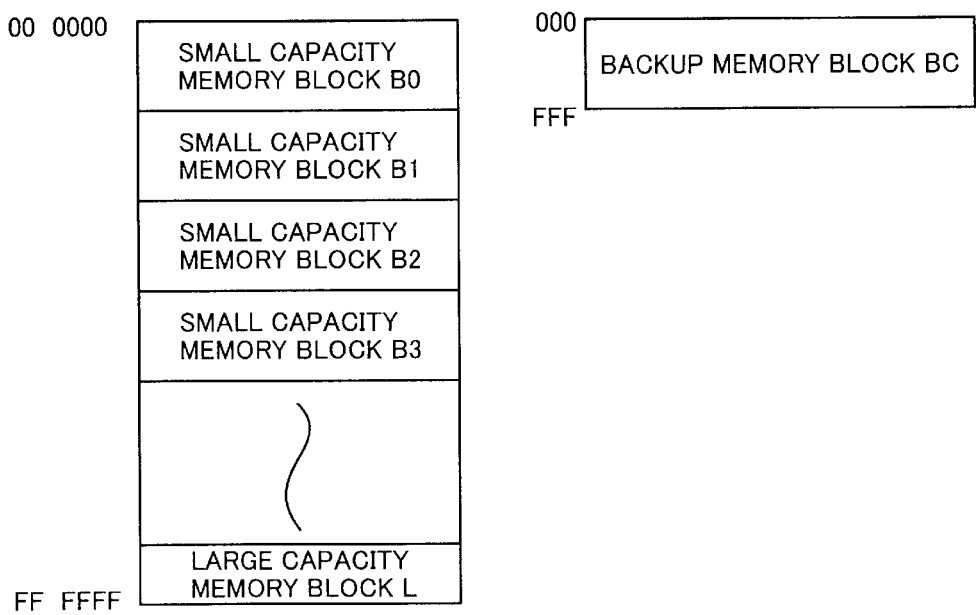
FIG. 2 is a representation of a memory map of a memory array 10.

Referring to FIG. 2, as one example, here, each of small capacity memory blocks B0 to B3 having a high rewrite frequency and a large capacity memory block L having a low rewrite frequency are assigned by using address regions having addresses of 000000 to FFFFFF. Furthermore, with backup memory block BC having the same capacity as a small capacity memory adopted, a small defective memory block can be replaced with a backup memory block without changing address assignment to non-defective small capacity memory blocks.

Referring again to FIG. 1, control circuit 30, by referring to address information of each of small capacity memory blocks assigned in address regions through internal bus IBS, can perform processing such as writing, reading, erasing and the like on a prescribed small capacity memory block. Control circuit 30 transmits a block select signal BS obtained by decoding address information of each of the small capacity memory blocks to block select circuit 20.

Determination circuit 40 reads defect information about each of the small capacity memory blocks stored in large capacity memory block L to determine defective or not. Furthermore, based on a result of such a determination, defect signal ES of each small capacity memory block is transmitted to block select circuit 20.

Block select circuit 20 includes a defect signal register 21. Defect signal register 21 is means for holding defect signal. Block select circuit 20 receives inputs of defect signal ES of each small capacity memory block and block select signal BS to generate a block select determination signal DBS selecting in memory array 10 either a selected memory block or backup memory block BC.

Block switch circuit 14 switches over to the selected memory block in memory array 10 according to block select determination signal DBS.

Figure 3:
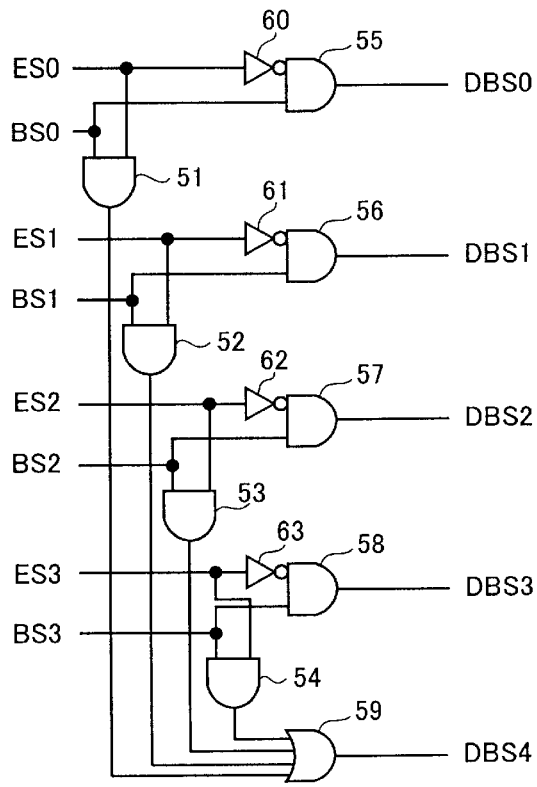
FIG. 3 is a diagram showing a large capacity memory block L storing defect information about a small capacity memory block.

Referring to FIG. 3, description will be given of a configuration in which one of small capacity memory blocks B0 to B3 in memory array 10 is saved and replaced with backup memory block BC. Here, block select determination signals DBS0 to DBS3 are signals selecting respective small capacity memory blocks B0 to B3, and block select signal DBS4 is a signal selecting backup memory block BC. Above block select determination signal DBS is a signal collectively representing block select determination signals DBS0 to DBS3. When block select determination signals DBS0 to DBS3 are at H level, it shows that selection of each of small capacity memory blocks B0 to B3 has been determined. Furthermore, when being at L level, it shows that non-selection of each of small capacity memory blocks BS0 to BS3 has been determined. When block select signal DBS4 is at H level, it shows that selection of backup memory block BC has been determined. Furthermore, when being at L level, it shows that non-selection of backup memory block BC has been determined.

Note that no necessity arises for limitation to small capacity memory blocks B0 to B3, but a configuration may be adopted in which replacement is performed with other small capacity memory blocks or another large capacity memory block. In addition, no limitation is required to single backup memory block BC, but a configuration including plural backup memory blocks may be allowed.

Block select circuit 20 includes: AND circuits 51 to 58; an OR circuit 59 and inverters 60 to 63.

Inverter 60 receives an input of defect signal ES0 to output an inverted signal thereof to AND circuit 55. AND circuit 55 receives an output signal from inverter 60 and block select signal BS0 to output a result of the AND logical operation as block select determination signal DBS0. Inverter 61 receives an input of defect signal ES1 to output an inverted signal thereof to AND circuit 56. AND circuit 56 receives an output signal from inverter 61 and block select signal BS1 to output a result of the AND logical operation as block select determination signal DBS1. Inverter 62 receives an input of defect signal ES2 to output an inverted signal thereof to AND circuit 57. AND circuit 57 receives an output signal from inverter 62 and block select signal BS2 to output a result of the AND logical operation as block select determination signal DBS2.

Inverter 63 receives an input of defect signal ES3 to output an inverted signal thereof to AND circuit 58. AND circuit 58 receives an output signal from inverter 63 and block select signal BS3 to output a result of the AND logical operation as block select determination signal DBS3. AND circuit 51 receives inputs of defect signal ES0 and block select signal BS0 to output a result of the AND logical operation to OR circuit 59. AND circuit 52 receives inputs of defect signal ES1 and block select signal BS1 to output a result of the AND logical operation to OR circuit 59. AND circuit 53 receives inputs of defect signal ES2 and block select signal BS2 to output a result of the AND logical operation to OR circuit 59. AND circuit 54 receives inputs of defect signal ES3 and block select signal BS3 to output a result of the AND logical operation to OR circuit 59. OR circuit 59 receives output signals from AND circuits 51 to 54 to output a result of the OR logical operation as block select determination signal DBS4.

Description will be given of an example in which block select circuit 20 replaces small capacity memory block B0 with backup memory block BC.

Block select signals BS0 to BS3 are signals selecting respective corresponding small capacity memory blocks BS0 to BS3. When each block select signal BS0 to BS3 is in a state of block selection, it is at H level. To the contrary, when in a state of block non-selection, it is at L level. Above block select determination signal BS is a signal collectively representing block select signals BS0 to BS3. Moreover, defect signals ES0 to ES3 are signals indicating a defective state of corresponding small capacity memory blocks B0 to B3. When small capacity memory blocks B0 to B3 are in a defective state, respective defect signals ES0 to ES3 are at H level. To the contrary, when in a normal state, respective defect signals ES0 to ES3 are at L level. Above defect signal ES is a signal collectively representing defect signals ES0 to ES3.

Here, when small capacity memory block B0 is in a defective state, defect signal ES0 is at H level. When block B0 is selected, that is a block signal BS0 is at H level, block select determination signal DBS0 is at L level since AND circuit 55 receives as an input, an inverted, L level defect signal ES0. Therefore, since small capacity memory block B0 is in a defective state, it is not selected. On the other hand, an output signal of AND circuit 51 is driven to H level since defect signal ES0 and block select signal BS0 are both at H level. Therefore, block select determination signal DBS4, which is an output signal of OR circuit 59, is driven to H level to replace block B0 with backup memory block BC. This applies in a similar way to cases where each of the other small capacity memory blocks B1 to B3 is replaced with backup memory block BC and, based on inputted each defect signal ES1 to ES3, it is determined whether or not substitution of backup memory block BC is performed. Since a circuit operation in each case is similar, none of detailed descriptions thereof is repeated.

Figure 4:
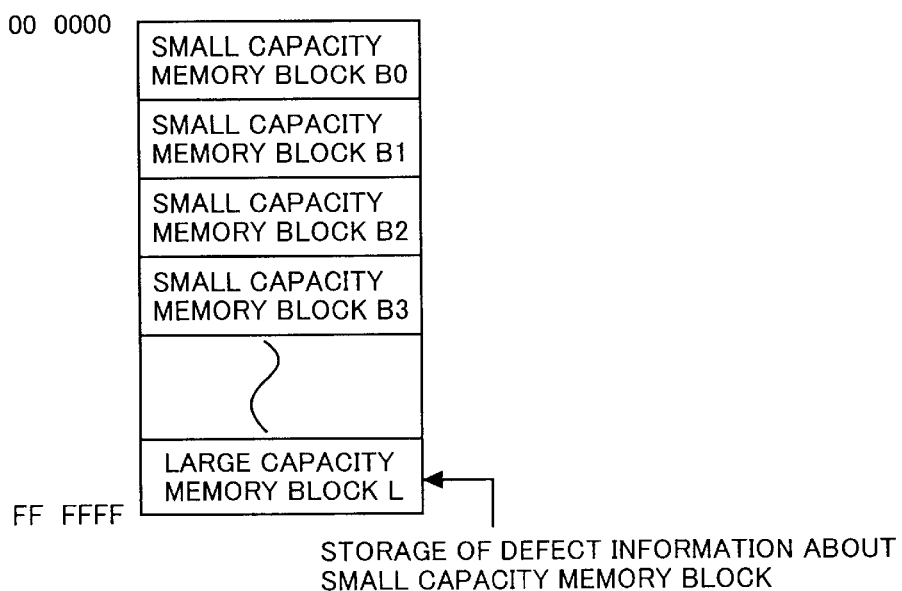
FIG. 4 is a diagram showing a large capacity memory block L into which defect information about a small capacity memory block is written.

Description will be given of a scheme in which defect information about each of small capacity memory blocks as shown in FIG. 4 is written into large capacity memory block L. Why defect information is here written into large capacity memory bock L is that by writing into a large capacity memory block having a low write frequency, a problem associated with a flash memory can be avoided of exceeding a limit number of write times.

Figure 5:
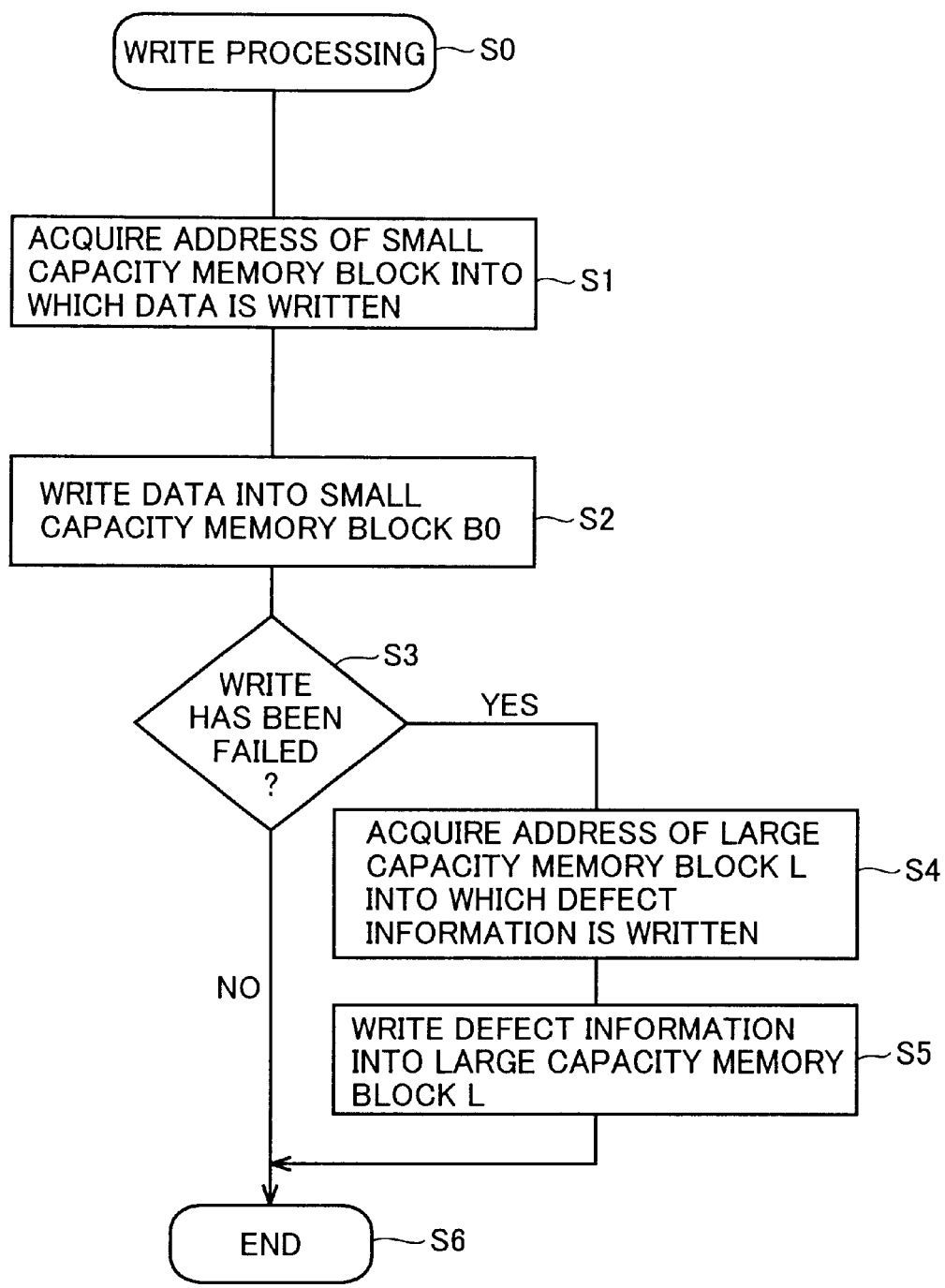
FIG. 5 is a flow chart showing write processing on a small capacity memory block.

Referring to FIG. 5, writing into small capacity memory block B0 is shown as one example in FIG. 5.

When control circuit 30 receives a write instruction, a write processing is executed (step S0). Then, control circuit 30 acquires address information of small capacity memory block B0 into which data is written through internal bus IBS (step S1). Then, control circuit writes data information into small capacity memory block B0 (step S2). Then, control circuit 30 determines whether or not write has been failed (step S3). Here, if the write is not failed, then the process ends (step S6). In step S3, if control circuit 30 has determined that the write is failed, then it acquires address information of large capacity memory block L into which defect information is written (step S4). Then, control circuit 30 writes defect information about small capacity memory block B0 into large capacity memory block L through internal bus IBS (step S5) and the write processing ends (step S6).

Figure 6:
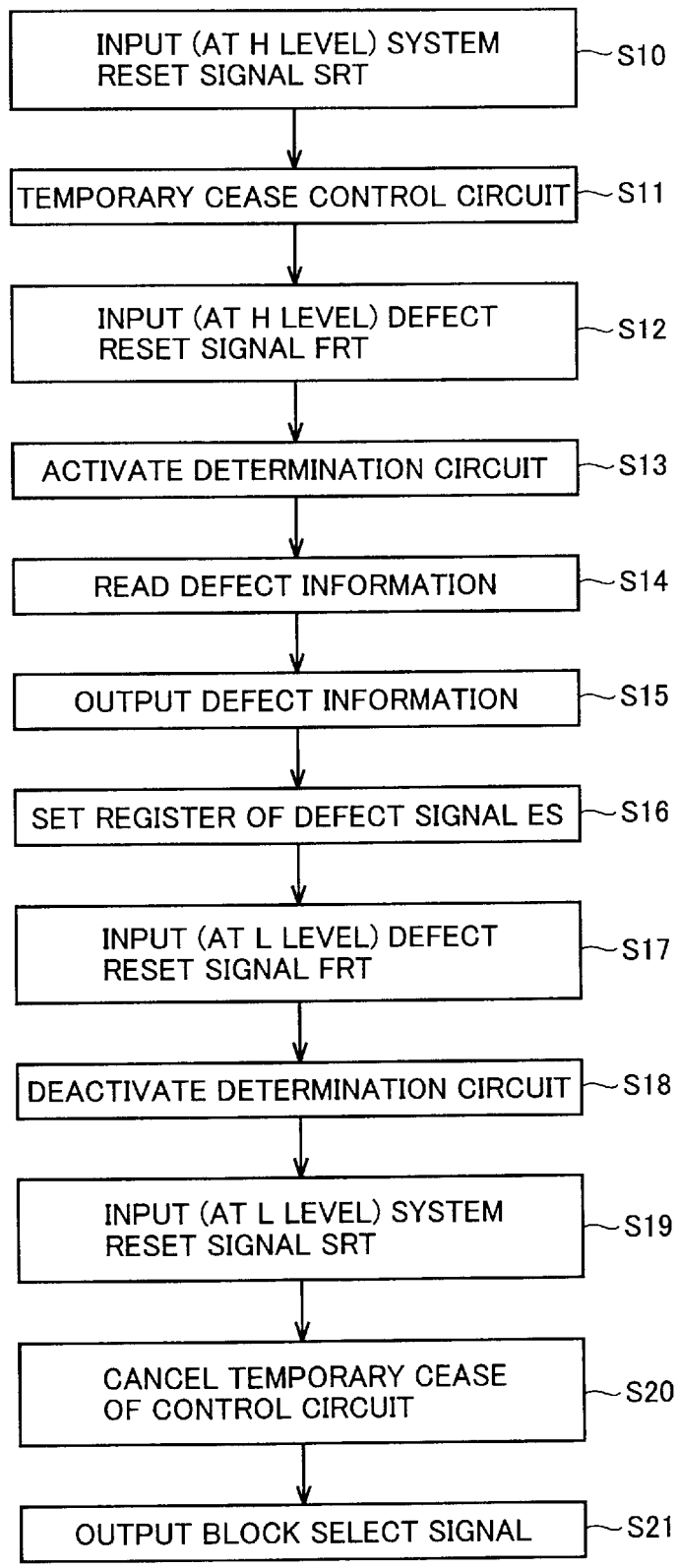
FIG. 6 is a flow chart showing a circuit operation in a non-volatile semiconductor device 100 saving a defective memory block according to the first embodiment of the present invention.

Description will be given of a circuit operation in non-volatile semiconductor memory device 100, saving a defective memory block according to the first embodiment of the present invention with reference to FIG. 1 and a flow chart of FIG. 6.

Here, it is assumed that defect information has already been stored in large capacity memory block L.

First of all, control circuit 30 receives an input (for example, at H level) of a system reset signal SRT by which the entire system is reset after defect determination or upon power up (step S10). Control circuit 30 pauses its operation temporarily by such an input (step S11). Then, determination circuit 40 receives an input (for example, at H level) of a defect reset signal FRT (step S12). Determination circuit 40 receives such an input and is activated (step S13). Then, determination circuit 40 reads defect information stored in large capacity memory block L in memory array 10 (step S14). Then, determination circuit 40 outputs read-out defect information to defect signal register 21 of block switch circuit 20 as defect signal ES (step S15). Transmitted defect signal ES is set to defect signal register 21 (step S16). Then, determination circuit 40 receives an input (for example, at L level) of defect reset signal FRT (step S17). Determination circuit 40 is deactivated by such an input (step S18). Then, control circuit 30 receives an input (for example, at L level) of system reset signal SRT (step S19). Temporary pause of control circuit 30 is cancelled (step S20) and control circuit 30 generates block select signal BS instructing selection of a memory block to output the signal to block select circuit 20 (step S21).

Thereby, block select circuit 20 outputs block select determination signal DBS, based on defect signal ES set to defect signal register 21 and inputted block select signal BS.

Hence, when a defective memory block is an access object, block select circuit 20 selects backup memory block BC to thereby enable saving of the defective memory block. Furthermore, by inputs of system reset signal SRT and defect reset signal FRT inputted after defect determination and upon power up, defect information is read out and defect signal ES is set to defect signal register 21 during a period when the entire system is reset; therefore, when a reset state is cancelled, preparation for switching between the defective memory block and the backup memory block has been made.

Figure 7A:
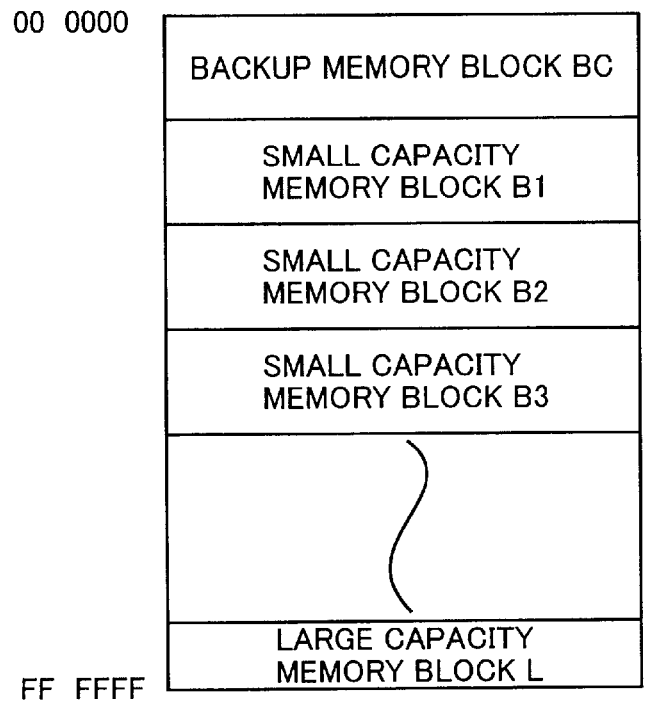
FIG. 7A is a representation of a memory map obtained by substituting a backup memory block BC for a defective memory block and performing address assignment according to an architecture of the present invention.
Figure 7B:
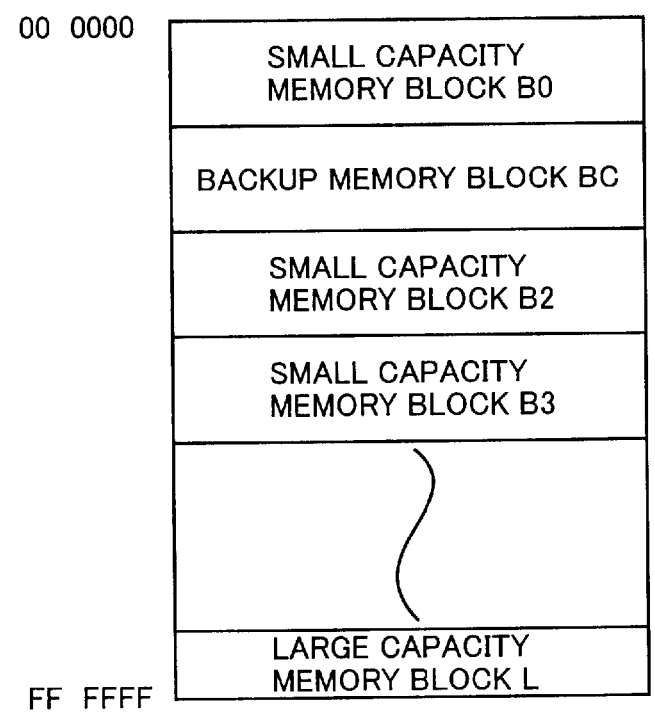
FIG. 7B is a representation of another memory map obtained by substituting a backup memory block BC for a defective memory block and performing address assignment according to an architecture of the present invention.

In FIG. 7A, an address is assigned so as to change over to backup memory block BC in accordance with defect information about small capacity memory block B0. In FIG. 7B, an address is assigned so as to change over to backup memory block BC in accordance with defect information about small capacity memory block B1.

According to an architecture of the present invention, by writing defect information into large capacity memory block L having a low write frequency when write into a small capacity memory block is failed and replacing a defective memory block with a backup memory block based on such defect information, not only the small capacity memory block having a high write frequency can be saved, but an useful time of a non-volatile semiconductor memory device can be extended.

Moreover, since when the entire system is reset, defect signal based on defect information of each small capacity memory block is set to defect signal register 21 to enable a preparation for saving a defective memory block, no necessity arises for executing a specific program, improving an efficiency in development.

Second Embodiment

Figure 8:
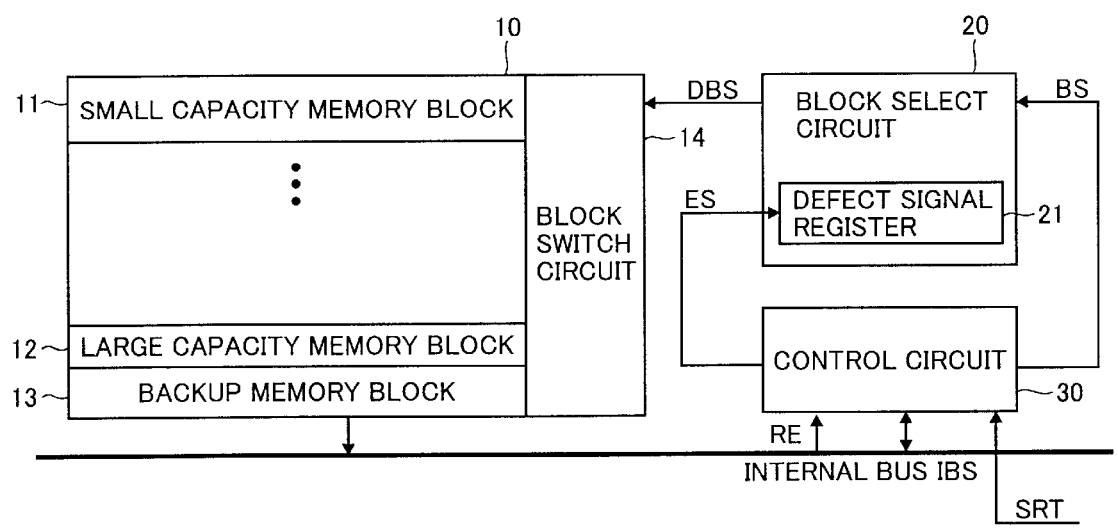
FIG. 8 is a circuit diagram of a configuration of a non-volatile semiconductor memory device 110 saving a defective memory block according to a second embodiment of the present invention.

Referring to FIG. 8, a non-volatile semiconductor memory device 110 is different from non-volatile semiconductor memory device 100 in comparison in that the former 110 does not include determination circuit 40 but control circuit 30 outputs defect signal ES to defect signal register 21.

In the first embodiment, description is given of an architecture in which the entire system is reset by inputting system reset signal SRT and defect signal ES is set to defect signal register 21 in a period till the reset state of the entire system is cancelled. In the second embodiment of the present invention, description will be given of an architecture in which after a reset state of the entire system is cancelled by inputting system reset signal SRT, defect signal ES is set to defect signal register 21.

Generally, a possibility is low that a small capacity memory block is selected after cancellation of a reset state of the entire system. This is because that directly after the cancellation of a reset state of the entire system, a large capacity memory block having a low rewrite frequency in which programs are stored is generally accessed. Therefore, no requirement occurs that a defective small capacity memory block is replaced with a backup memory block directly after cancellation of a reset state of the entire system.

Figure 9:
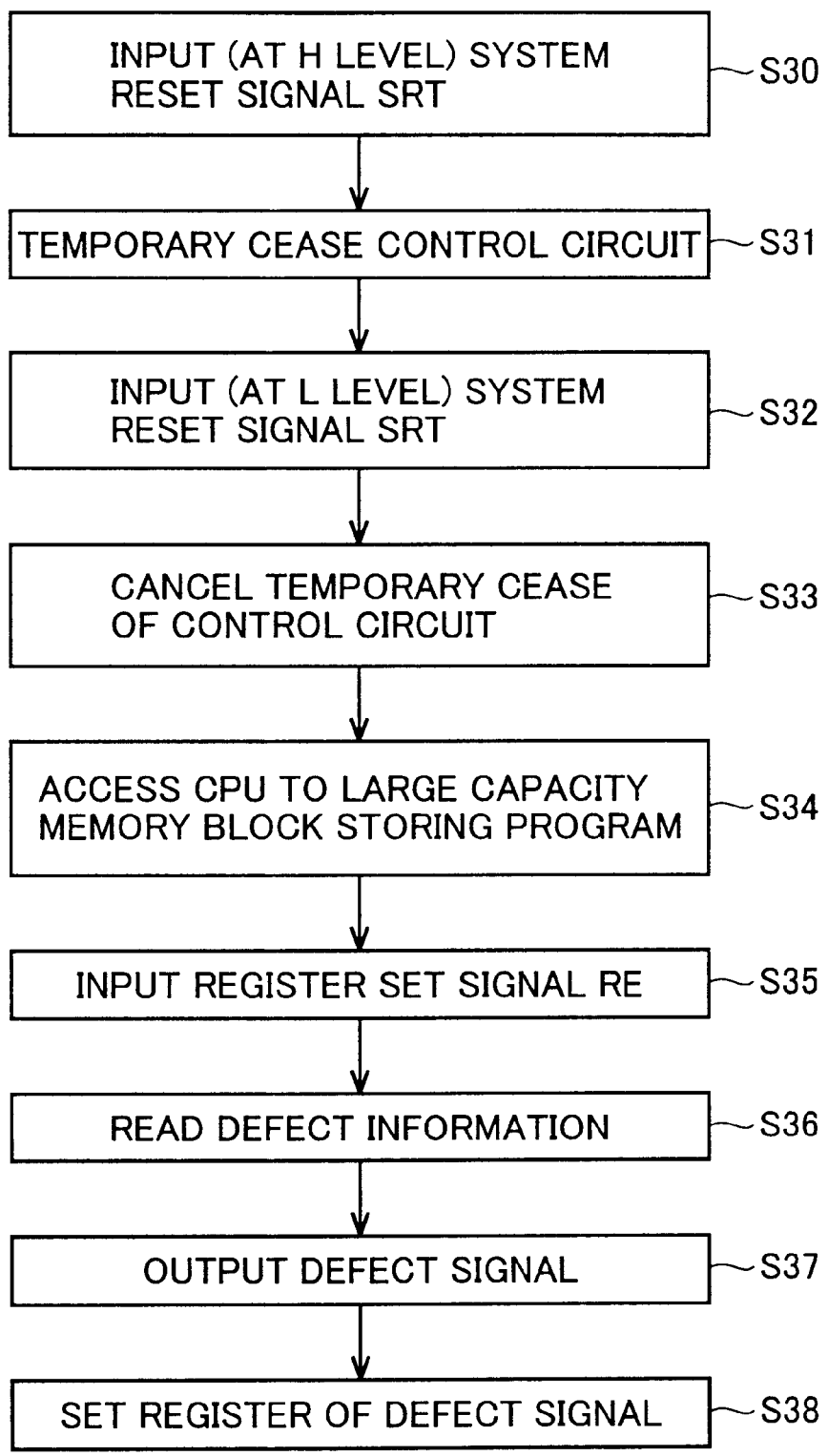
FIG. 9 is a flow chart setting a defect signal ES to a defect signal register 21.
Figure 10:
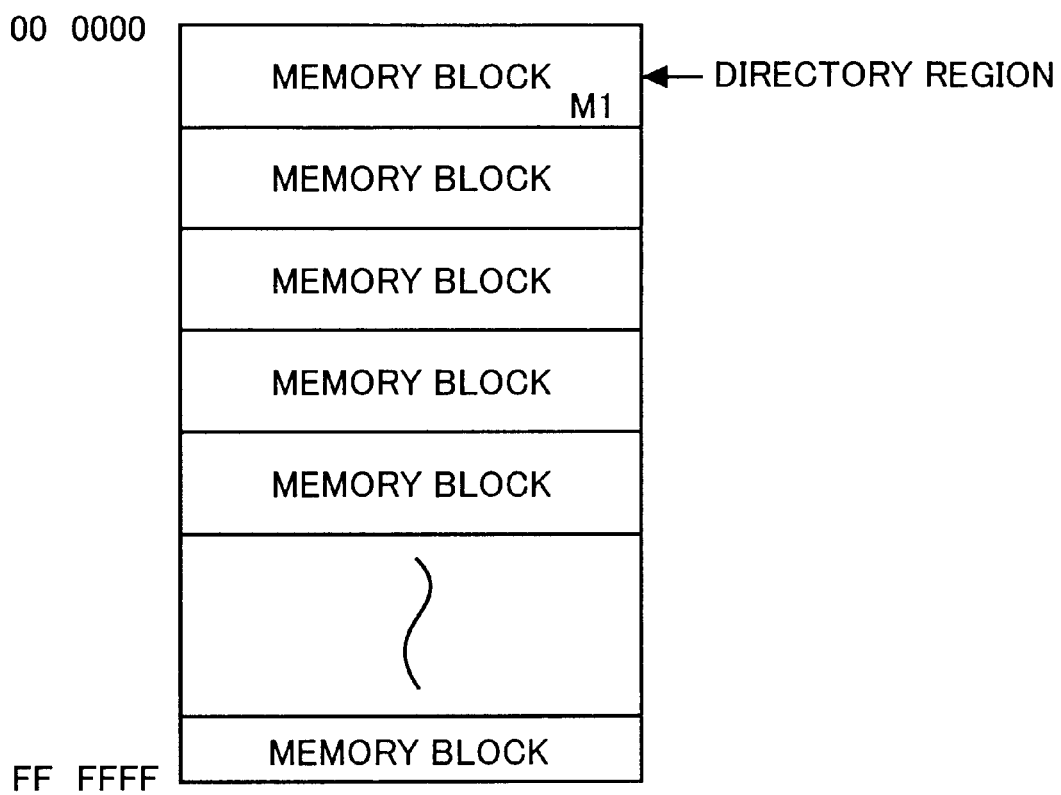
FIG. 10 is a representation of a memory map obtained by performing address assignment in each memory block in a general flash memory.

Description will be given of an architecture in which defect signal ES is set to defect signal register 21 using a flow chart of FIG. 9.

Control circuit 30 receives an input (here at H level) of system reset signal SRT inputted after defect determination and upon power on (step S30). Control circuit 30 pauses its operation temporarily upon receipt of such an input (step S31).

Then, control circuit 30 receives an input (here at L level) of system reset signal SRT for starting operation of internal circuits (step S32). Control circuit 30 cancels a temporary pause of operation upon receipt of such an input (step S33). Here, though not shown, access is performed from CPU controlling the entire system, and provided outside non-volatile semiconductor memory device to a large capacity memory block storing program information (step S34). Note that the accessible large capacity memory block is different from large capacity memory block L storing defective information. In company with the access, furthermore, a defect set signal RE is inputted to control circuit 30 from CPU through internal bus BUS (step S35). Then, control circuit 30 receives an input of defect set signal RE and reads defect information from large capacity memory block L (step S36). Then, control circuit 30 determines a defect from defect information about each small capacity memory block, which is read out, to output defect information ES to defect signal register 21 (step S37). Defect signal register 21 sets inputted defect signal ES (step S38).

Usually, control circuit 30 accesses a large capacity memory block storing program information after cancellation of a reset state of the entire system. Therefore, there is a low possibility of a problem being resulted in operation even if defect signal ES is set to defect signal register 21 after control circuit 30 receives defect set signal RE inputted in company with such access.

Furthermore, when access is made to small capacity memory block in the next turn, a preparation has been made for switching between backup memory block and defective memory block since defect signal ES is set to defect signal register 21.

With such an architecture adopted, an effect similar to that of the first embodiment can be attained without providing determination circuit 40.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:

a memory array including a plurality of first memory blocks including memory cells having a high data rewrite frequency, a second memory block including memory cells having a low data rewrite frequency and a redundancy memory block for use in substitution for a defective memory block among said plurality of first memory blocks;

a control circuit determining whether or not a defect arises in each of said plurality of first memory blocks, which is an object for data writing, when data writing is performed on each of said plurality of first memory blocks, and storing defect information for indicating said defective memory block into a first region of said second memory block if a defect is detected; and a select circuit for selecting said redundancy memory block in association with selection of said defective memory block based on said defect information stored in said first region of said second memory block and select information for indicating selection of each of said plurality of first memory blocks.

2. The non-volatile semiconductor memory device according to claim 1, wherein said second memory block further includes: a second region having information that is an access object in association with cancellation of a reset state and according to an instructing signal inputted externally after said reset state is cancelled as access to said second region, said control circuit reads said defect information stored in said first region of said second memory block and furthermore outputs said defect information to said select circuit.

3. The non-volatile semiconductor memory device according to claim 1, further comprising:

a determination circuit for outputting a defect signal to said select circuit based on said defect information stored in said first region of said second memory block, wherein said select circuit selects one of said plurality of first and said redundancy memory blocks based on a select signal selecting one of said plurality of first memory blocks and on said defect signal.

4. The non-volatile semiconductor memory device according to claim 3, wherein during a period when operation of said control circuit pauses, said determination circuit reads said defect information stored in said first region of said second memory block and furthermore outputs said defect signal to said select circuit according to said read-out defect information and after the pause of operation of said control circuit is cancelled, said select circuit selects said redundancy memory block according to said inputted defect signal and said inputted select signal in association with selection of said defective memory block.

5. The non-volatile semiconductor memory device according to claim 1, wherein the data storage capacity of each of said plurality of first memory blocks is smaller than a data storage capacity of said second memory block.

6. The non-volatile semiconductor memory device according to claim 1, wherein said memory cell stores data, writable and erasable electrically, in a non-volatile way.

* * * * *